United States Patent
Yamaguchi et al.

(10) Patent No.: US 6,344,666 B1
(45) Date of Patent: Feb. 5, 2002

(54) AMPLIFIER-TYPE SOLID-STATE IMAGE SENSOR DEVICE

(75) Inventors: Tetsuya Yamaguchi; Hisanori Ihara, both of Yokohama; Hiroaki Ishiwata, Kawasaki; Akiko Mori, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/407,847

(22) Filed: Sep. 29, 1999

(30) Foreign Application Priority Data

Nov. 11, 1998 (JP) .............................. 10-320589

(51) Int. Cl.$^7$ ..................... H01L 31/00; H01L 29/768; H01L 29/76
(52) U.S. Cl. ................. 257/98; 257/443; 257/432; 257/435; 257/222; 257/213; 257/233; 257/231; 257/446
(58) Field of Search ................ 257/443, 432, 257/435, 222, 213, 233, 98, 231, 446

(56) References Cited

U.S. PATENT DOCUMENTS 5,773,859 A * 6/1998 Ueno ......................... 257/294
6,008,511 A * 12/1999 Tokumitsu et al. ......... 257/232
6,069,376 A * 5/2000 Merill ........................ 257/291
6,194,244 B1 * 2/2001 Yamaguchi et al. .......... 438/57

FOREIGN PATENT DOCUMENTS

JP 03147366 A * 11/1989
JP 404343471 A * 11/1992

* cited by examiner

Primary Examiner—Stephen D. Meier
Assistant Examiner—James Mitchell
(74) Attorney, Agent, or Firm—Finnegan, Henderson, Farabow, Garrett, & Dunner, L.L.P.

(57) ABSTRACT

In an amplifier-type solid-state image sensor device, each unit cell comprises a photoconverter and a signal scanning circuit in an image sensing region on a semiconductor substrate, a metal film has an opening region for defining regions where light is radiated in the photoconverters of the unit cells, and a center position of the opening region of the metal film is displaced to the side of the center of the image sensing region with respect to a center portion of the photoconverter, so that the amount of light entering the center of the semiconductor chip and the peripheral portions of the semiconductor chip can be made equal, thereby obtaining substantially the same sensitivity at the center and peripheral portions of the semiconductor chip.

21 Claims, 4 Drawing Sheets

AMPLIFIER-TYPE SOLID-STATE IMAGE SENSOR DEVICE

BACKGROUND OF THE INVENTION

The present invention relates to an amplifier-type solid-state image sensor device for obtaining a signal charge using a photoconverter such as a photodiode, amplifying and extracting the obtained signal charge, and more particularly relates to an amplifier-type solid-state image sensor device wherein the positional relationship between the photoconverter and an opening in a metal film which defines the region where light is received in the photoconverter, is improved.

A solid-state image sensor device for obtaining an image of an object using a lens has a problem that pixels near the center of the semiconductor chip have a different amount of light injected thereto from pixels near the peripheral portion of the semiconductor chip. More specifically, the amount of light in the center of the semiconductor chip is great, but the amount of light at the peripheral portion of the semiconductor chip is small. Consequently, the level of photo-sensitivity differs between at the center of the semiconductor chip and the peripheral portion of the semiconductor chip. Conventionally, this problem is solved by a method known as scaling, whereby the position of a microlens in the color filter portion is slightly displaced horizontally toward the center of the photodiode (by approximately 0.001 μm per pixel). Scaling prevents the level of photosensitivity at the peripheral portion of the semiconductor chip from falling below that at the center the semiconductor chip.

In a CCD-type solid-state image sensor device, as shown in FIG. 6, an aluminum lightproof film (or aluminum wire) 65, which defines the opening in the photodiode 62, covers capacitor electrodes (polysilicon) or gate wires (polysilicon) 63 and extends to the edge of the photodiode 62. Therefore, the difference in level between the surface of the photodiode 62 and the lightproof film 65 in the opening, is almost entirely dependent on the thickness of the lightproof film 65. Since the lightproof film 65 is extremely thin, the difference in level between the surface of the photodiode 62 and the lightproof film 65, which defines the opening, is extremely small. This makes it possible to correct photosensitivity using the scaling method described above. In FIG. 6, the numeral 61 represents a semiconductor substrate, 64 represents an interlayer insulating film, 66 and 67 represents flattening insulating films, and 68 represents a microlens.

By contrast, in an amplifier-type solid-state image sensor device known as a CMOS sensor, the difference in level between the surface of the photodiode 72 and the metal film (aluminum wire, or aluminum lightproof film, or the like) 74, which defines the opening, is generally more than 1 μm, as shown in FIG. 7. As a result, even when the conventional technique of scaling is carried out using the microlens 76 of the color filter portion, the metal film 74, which defines the opening of the photodiode 72, cuts off the injected light, reducing the amount of light injected to the photodiode 72 at the peripheral portion of the semiconductor chip. Therefore, sensitivity cannot be adequately corrected by scaling with the microlens 76. Thus conventional CMOS sensors have a disadvantage that sensitivity cannot be adequately corrected, due to the fact that the difference in level between the surface of the photodiode and the metal film which defines the opening, is more than 1 μm, thereby making it impossible to match the amount of light injected at the center of the semiconductor chip to the amount injected at the peripheral portion of the semiconductor chip, even by scaling with the microlens. In FIG. 7, numerals 73 and 74 represent insulating films for flattening, 77 represents an object lens, and 78 represents the light path.

BRIEF SUMMARY OF THE INVENTION

The present invention has been devised to solve the problems described above, and aims to provide an amplifier-type solid-state image sensor device wherein the amounts of light injected to the center and peripheral portion of the image sensing region can be matched even when there is a considerable difference in level between the surface of the photodiode and the metal film which defines the opening, thereby obtaining closely similar levels of photosensitivity at the center and peripheral portion of the image sensing region.

In order to solve the problems described above, an amplifier-type solid-state image sensor device according to a first aspect of the present invention comprises a plurality of unit cells, each comprising a photoconverter and a signal scanning circuit, arranged two-dimensionally in an image sensing region on a semiconductor substrate; signal lines provided on the semiconductor substrate, for reading out signals from the cells in the image sensing region; and a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell.

In the amplifier-type solid-state image sensor device according to the first aspect of the present invention, the amplifier-type solid-state image sensor device may further comprise microlenses arranged for the unit cells, a center position of each of the microlenses being displaced to the side of the center of the image sensing region with respect to a center position of the photoconverter of a corresponding unit cell.

In the amplifier-type solid-state image sensor device according to the first aspect of the present invention, the metal film may comprise a aluminum wire film.

In the amplifier-type solid-state image sensor device according to the first aspect of the present invention, the metal film may comprise a film made of a refractory metal.

In the amplifier-type solid-state image sensor device according to the first aspect of the present invention, the refractory metal may include titanium, tungsten, and molybdenum.

In the amplifier-type solid-state image sensor device according to the first aspect of the present invention, the metal film may comprise a film made of a metal compound.

In the amplifier-type solid-state image sensor device according to the first aspect of the present invention, the metal film may comprise a aluminum lightproof film.

An amplifier-type solid-state image sensor device according to a second aspect of the present invention comprises a plurality of unit cells, each comprising a photoconverter and a signal scanning circuit, arranged two-dimensionally in an image sensing region on a semiconductor substrate; signal lines provided on the semiconductor substrate, for reading out signals from the cells in the image sensing region; and a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell, the areas of those of the openings of the metal film, which are in a peripheral portion of the image sensing region, being larger than the areas of those of the openings of the metal film, which are in a center portion of the image sensing region.

In the amplifier-type solid-state image sensor device according to the second aspect of the present invention, the amplifier-type solid-state image sensor device may further comprise microlenses arranged for the unit cells, a center position of each of the microlenses being displaced to the side of the center of the image sensing region with respect to a center position of the photoconverter of a corresponding unit cell.

In the amplifier-type solid-state image sensor device according to the second aspect of the present invention, the metal film may comprise a aluminum wire film.

In the amplifier-type solid-state image sensor device according to the second aspect of the present invention, the metal film may comprise a film made of a refractory metal.

In the amplifier-type solid-state image sensor device according to the second aspect of the present invention, the refractory metal may include titanium, tungsten, and molybdenum.

In the amplifier-type solid-state image sensor device according to the second aspect of the present invention, the metal film may comprise a film made of a metal compound.

In the amplifier-type solid-state image sensor device according to the second aspect of the present invention, the metal film may comprise a aluminum lightproof film.

An amplifier-type solid-state image sensor device according to a third aspect of the present invention comprises a plurality of unit cells, each comprising a photoconverter and a signal scanning circuit, arranged two-dimensionally in an image sensing region on a semiconductor substrate; signal lines provided on the semiconductor substrate, for reading out signals from the cells in the image sensing region; and a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell, the areas of those of the openings of the metal film, which are in a peripheral portion of the image sensing region, being larger than the areas of those of the openings of the metal film, which are in a center portion of the image sensing region, the areas of the photoconverters of those of the unit cells, which are in a peripheral portion of the image sensing region, being larger than the areas of the photoconverters of those of the unit cells, which are in a center portion of the image sensing region.

In the amplifier-type solid-state image sensor device according to the third aspect of the present invention, the amplifier-type solid-state image sensor device may further comprise microlenses arranged for the unit cells, a center position of each of the microlenses being displaced to the side of the center of the image sensing region with respect to a center position of the photoconverter of a corresponding unit cell.

In the amplifier-type solid-state image sensor device according to the third aspect of the present invention, the metal film may comprise a aluminum wire film.

In the amplifier-type solid-state image sensor device according to the third aspect of the present invention, the metal film may comprise a film made of a refractory metal.

In the amplifier-type solid-state image sensor device according to the third aspect of the present invention, the refractory metal may include titanium, tungsten, and molybdenum.

In the amplifier-type solid-state image sensor device according to the third aspect of the present invention, the metal film may comprise a film made of a metal compound.

In the amplifier-type solid-state image sensor device according to the third aspect of the present invention, the metal film may comprise a aluminum lightproof film.

The effects of the present invention are as follows. By displacing the center of the opening region of the metal film to the sides of the center of the image sensing region with respect to the center of the photoconverter, it is possible to prevent light diagonally entering the photoconverter from being cut off by the metal film, consequently avoiding reduction of sensitivity in the peripheral portions of the image sensing region. Therefore, even when there is a considerable difference in level between the surface of the photodiode and the metal film defining the openings, the amounts of light entering the center and peripheral portions of the image sensing region can be matched, thereby obtaining similar sensitivity in the center and peripheral portions of the image sensing region.

Furthermore, since the opening regions of the metal film near the peripheral portion of the image sensing region are wider than the opening regions of the metal film near the center of the image sensing region, reduction in sensitivity in the peripheral portion of the image sensing region can be reduced even more reliably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described in detail below with reference to the drawings.

Embodiment 1

Figure 1:
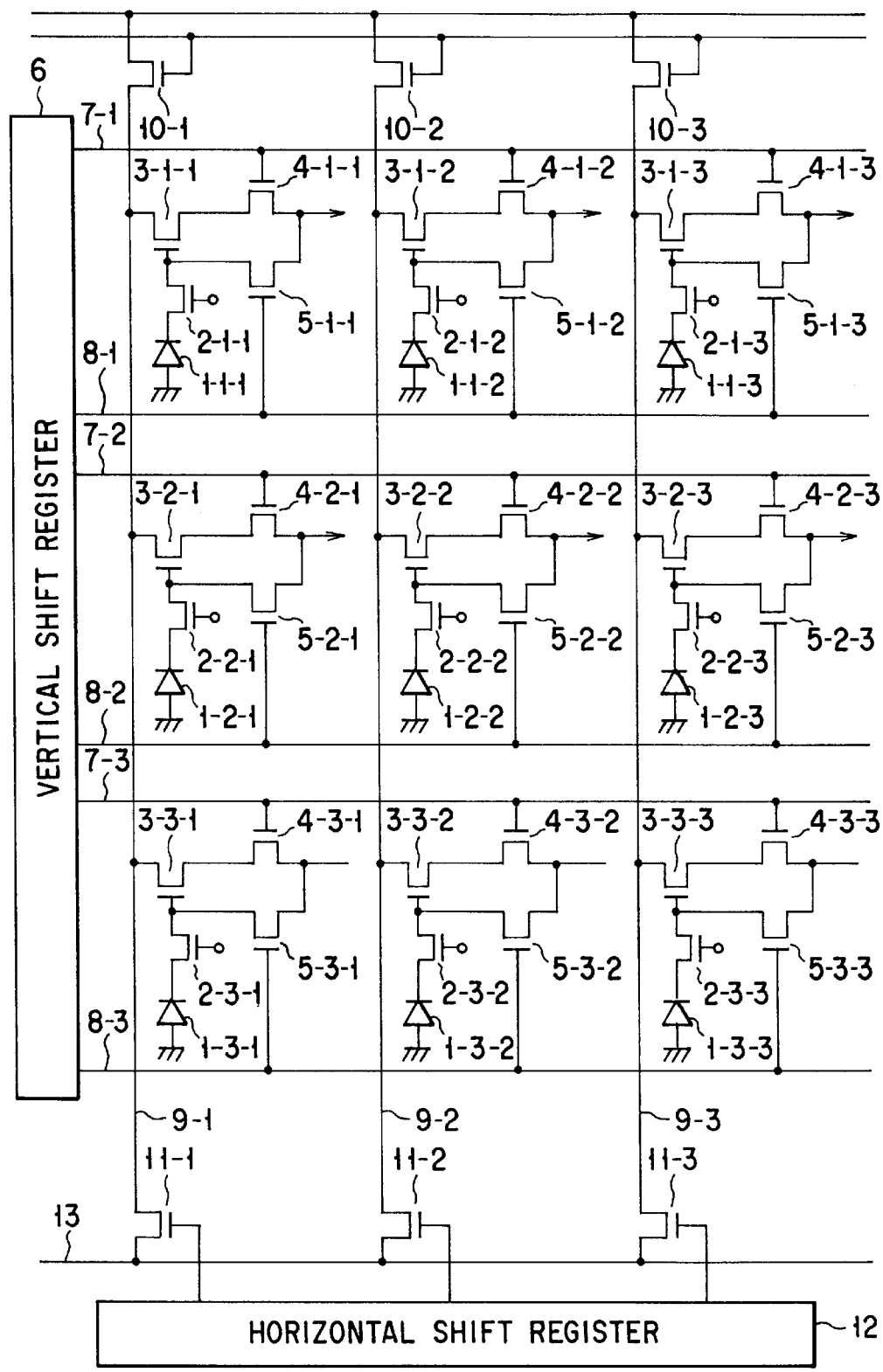
FIG. 1 is a circuit diagram of a CMOS sensor device according to a first embodiment of the present invention.

FIG. 1 is a diagram showing a circuit of a CMOS sensor according to a first embodiment of the present invention.

Unit cells are arranged two-dimensionally in a 3×3 structure, each cell comprising a photodiode 1 (1-1-1, 1-1-2, 1-3-3) for photoconversion, a read out transistor 2 (2-1-1, 2-1-2, 2-3-3) for reading out signals from the photodiodes, an amplifier transistor 3 (3-1-1, 3-1-2, 3-3-3) for amplifying the charge of the signals once they have been read out, a vertical selector transistor 4 (4-1-1, 4-1-2, 4-3-3) for selecting a line for reading out the signals, and a reset transistor 5 (5-1-1, 5-1-2, 5-3-3) for resetting the signal charge. Read out transistor 2, amplifier transistor 3, vertical selector transistor 4, and reset transistor 5 constitute a signal scanning circuit. For reasons of simplification, FIG. 1 shows a 3×3 arrangement, but in fact a far greater number of unit cells are provided in two-dimensional rows.

Horizontal address lines 7 (7-1, 7-2, 7-3) run horizontally from the vertical shift register 6, and are connected to the gates of the vertical selector transistors 4, selecting the line through which a signal is read. Reset lines 8 (8-1, 8-2, 8-3) are connected to the gates of the reset transistors 5. The sources of the amplifier transistors 3 is connected to vertical signal lines 9 (9-1, 9-2, 9-3), and load transistors 10 (10-1, 10-2, 10-3) are provided at one end of each vertical signal line 9. The other end of each vertical signal line 9 is connected via horizontal selector transistors 11 (11-1, 11-2, 11-3), selected by a select pulse supplied from a horizontal shift register 12, to a horizontal signal line 13.

The of the circuit described above is basically the same as a conventional device, but the following element structure is different from conventional devices, especially the positional relationship between the opening in the metal film and the photodiode (photoconverter).

Figure 2:
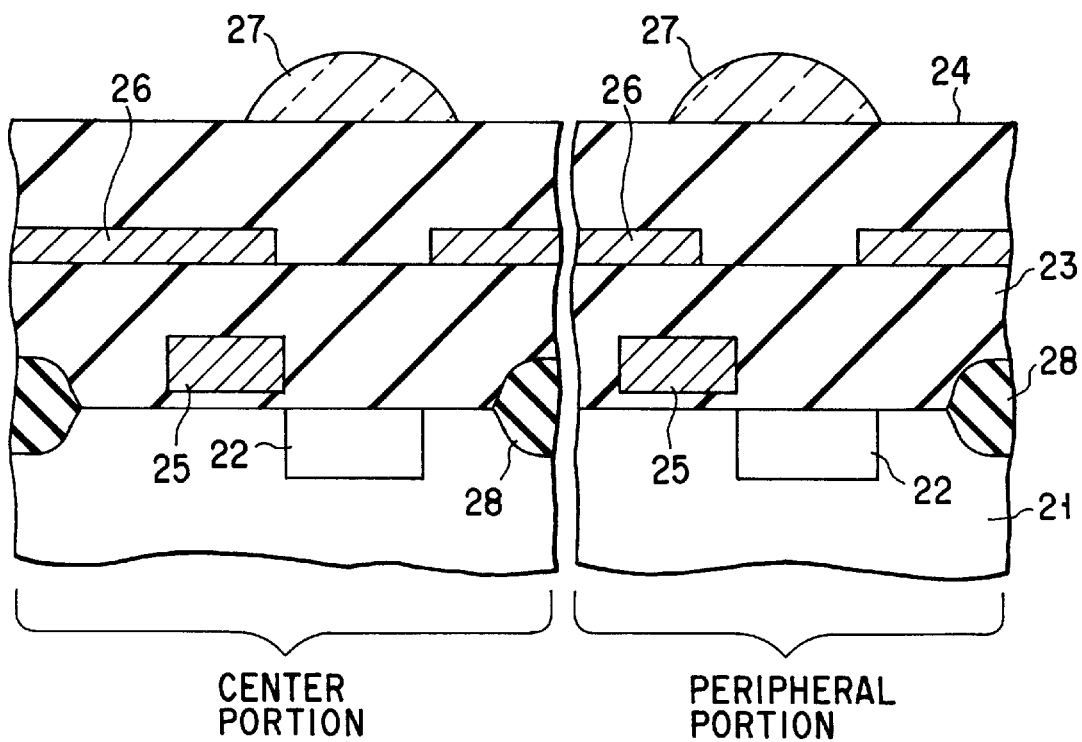
FIG. 2 is a diagram to explain the first embodiment showing a circuit and shows a cross-sectional view of a structure of an element, illustrating the positional relationship between a photoconverter and a metal film which defines the area of an opening in a photodiode.

FIG. 2 is a cross-sectional view of the structure of an element to explain the present embodiment, and in particular shows the positional relationship between the photodiode (photoconverter) and metal film which defines the area of the opening in the photodiode. In the diagram, numeral 21 represents a semiconductor substrate, 22 represents photodiodes (photoconverter), 23 represents flattening layers (insulating film), 24 represents flattening layers or color filters, 25 represents read gate electrodes or gate wires, 26 represents a metal film functioning as a lightproof film such as a wire electrode, 27 represents a microlens, and 28 represents element isolation regions (LOCOS).

As shown in the left half of FIG. 2, at a pixel (i.e. the unit cell) in the center of the semiconductor chip (i.e. the image sensing region), the center of the opening in the metal film 26 matches the center of the photodiode (i.e. the photoconverter) 22. On the other hand, as shown in the right half of FIG. 2, at a pixel in the peripheral portion of the semiconductor chip, the center of the opening in the metal film 26 is displaced toward the side of the semiconductor chip center with respect to the center of the photodiode 22. When the center of the opening in the metal film 26 is displaced toward the side of the semiconductor chip center with respect to the center of the photodiode 22 at a pixel in the peripheral portion of the semiconductor chip, the microlens 27 is also displaced toward the center of the semiconductor chip.

Figures 3A, 3B, 3C:
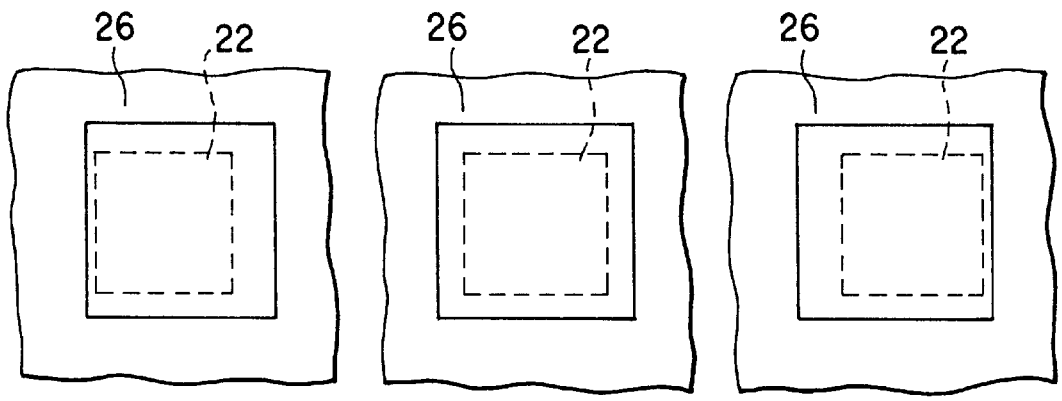
FIGS. 3A, 3B, and 3C are diagrams to explain the first embodiment of the present invention, and show plan views of the positional relationship between a photoconverter and a metal film which defines the area of an opening in a photodiode, at the center of a semiconductor chip or at a peripheral portion of a semiconductor chip.

FIGS. 3A to 3C are plan pattern views showing the positional relationship between the photodiode 22 and the metal film 26 which determines the area of the opening, in the center of the semiconductor chip or in the peripheral portion of the semiconductor chip, when the semiconductor chip is viewed from above. FIG. 3A shows the positional relationship between the photodiode 22 and the metal film 26 in the peripheral portion of the left side of the center of the semiconductor chip, the center of the opening of the metal film 26 being displaced to the right side (i.e., the center side of the semiconductor chip) with respect to the center of the photodiode 22. This pixel is not depicted in FIG. 2. FIG. 3B shows the positional relationship between the photodiode 22 and the metal film 26 in the center of the semiconductor chip, the center of the opening of the metal film 26 matching the center of the photodiode 22. This pixel corresponds to the pixel on the left side of FIG. 2. FIG. 3C shows the positional relationship between the photodiode 22 and the metal film 26 on the right side of the center of the semiconductor chip, the center of the opening of the metal film 26 being displaced to the left side (i.e., the center side of the semiconductor chip) with respect to the center of the photodiode 22. This pixel corresponds to the pixel on the right side of FIG. 2.

Next, a method for manufacturing the solid-state image sensor device of FIG. 2 will be explained.

For instance, a p well is provided in a p-type semiconductor layer using a conventional manufacturing method, that is, by ion implantation and thermal diffusion. Thereafter, LOCOS regions are provided to isolate the elements, ions are implanted to set the threshold value of the transistors, and a gate electrode or a gate wire is provided. Generally, the gate electrode or gate wire 25 normally comprises polysilicon, but it is not limited to polysilicon.

Next, a photodiode for photoconversion is manufactured by first applying a resist, and then the resist is patterned to produce a resist pattern. Next, using the resist pattern as a mask, a $2 \times 10^{13}$ cm$^{-2}$ dose of ions having energy of for instance 400 keV are implanted into the substrate to form an n-type semiconductor layer comprising P (phosphorus) or the like, and a photodiode 22 of the desired shape is thereby provided.

Next, the surface of a wafer is made smooth by covering the surface of the wafer with BPSG or a glass material such as PSG. Thereafter, a lightproof film is provided by applying a coating of, for instance, 400 nm of a metal material (a metal such as aluminum, titanium, tungsten, molybdenum, or the like, or a metal compound thereof, or the like). Then, a resist is applied and patterned to produce a resist pattern. The center of the opening in the mask used during this patterning matches the center of the photodiode 22 in a pixel in the center of the semiconductor chip. In actual fact, there will be a slight deviation of approximately 0.1 to 0.2 μm due to displacement during patterning.

On the other hand, in the case of the photodiode 22 in a pixel at the peripheral portion of the semiconductor chip, the center of the opening in the mask is displaced toward the center of the semiconductor chip from the center of the photodiode 22. Therefore, when a resist pattern is obtained by patterning with such a mask, if the photodiode 22 is in a pixel at the peripheral portion of the semiconductor chip, the center of the opening in the resist pattern is displaced toward the center of the semiconductor chip from the center of the photodiode 22. For this reason, when a metal film material is patterned using this resist pattern in the subsequent process, if the photodiode 22 is in a pixel at the peripheral portion of the semiconductor chip, the center of the opening in the obtained metal film 26 will be displaced toward the center of semiconductor chip from the center of the photodiode 22.

Next, using the resist pattern as a mask, the metal film material is patterned by a method such as RIE (reactive ion etching) to form a metal film 26 having a desired pattern to define the opening of the photodiode 22. Thereafter, a passivation film (e.g. SiN) is provided using a conventional method, and a color filter and a microlens are provided, thereby completing the solid-state image sensor device of FIG. 2.

Thus, in the present embodiment, in pixels in the center of the semiconductor chip, the center of the opening in the metal film 26, which functions as a lightproof film, is aligned with the center of the opening in the photodiode 22. On the other hand, in pixels in the peripheral portions of the semiconductor chip, the center of the opening in the metal film 26 is not aligned with the center of the opening in the photodiode 22, but is displaced to the center of the semiconductor chip. Consequently, it is possible to prevent light diagonally entering the photodiode 22 from being cut off by the metal film 26, ensuring that photosensitivity is not reduced in the peripheral portions of the semiconductor chip. Therefore, even when there is a considerable difference in level between the surface of the photodiode and the metal film defining the opening, the amounts of light entering the center and peripheral portions of the semiconductor chip can be matched, obtaining uniform sensitivity in the center and peripheral portions of the semiconductor chip.

Furthermore, there is no need to greatly alter the conventional. It is sufficient merely to change the position of the opening in the metal film 26, which forms an interconnection layer. This has an advantage of enabling the structure of the present invention to be easily realized. It has a further advantage that the manufacturing method is simple, it being necessary only to alter the pattern of the mask used to form the opening in the metal film 26.

Embodiment 2

Figure 4A:
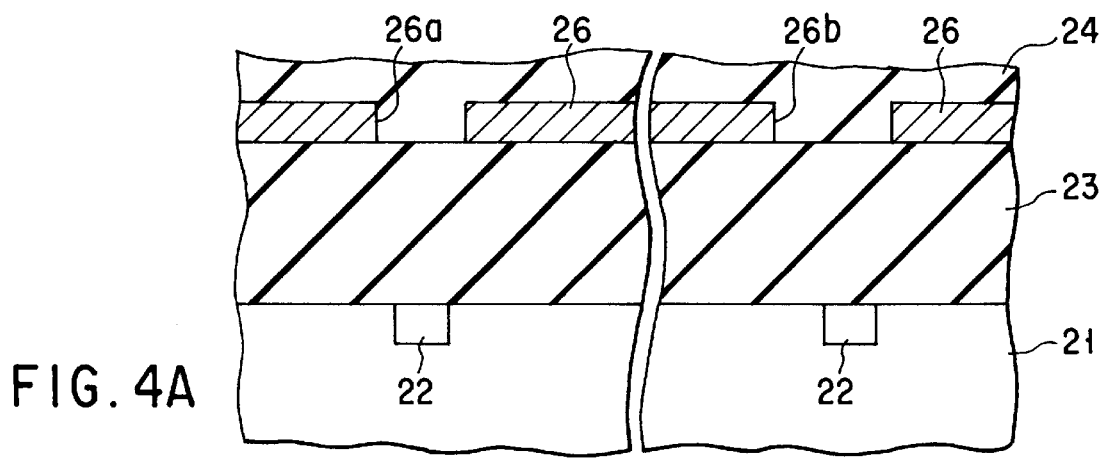
FIGS. 4A and 4B are diagrams to explain a sensor device of a second embodiment of the present invention, FIG. 4A showing a schematic cross-sectional view of the sensor device, in particular, the positional relationship of a photoconverter and a metal film which defines the area of an opening in a photodiode, FIG. 4B showing a plan pattern view thereof.
Figure 4B:
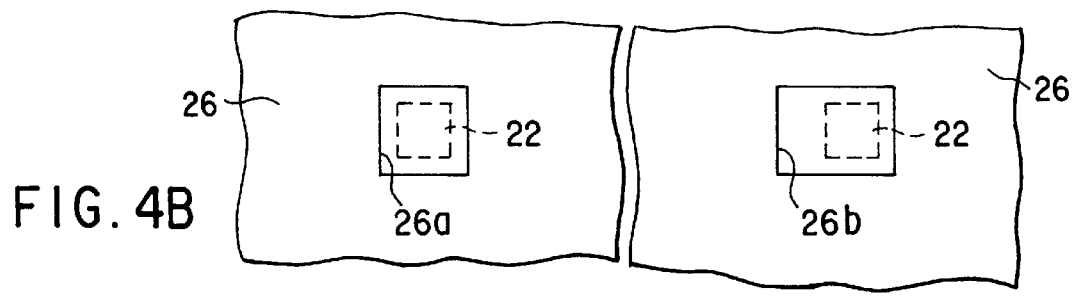

FIGS. 4A and 4B schematically show element structures of a CMOS sensor according to a second embodiment of the present invention, FIG. 4A being a cross-sectional view, and FIG. 4B, a plan view. In particular, these diagrams illustrate the positional relationship between a photodiode (photoconverter) and a metal film which defines the area of the opening in the photodiode. Parts identical to those in FIG. 2 are represented by the same reference numerals, and further detailed explanation thereof is omitted. The overall circuit is the same as that shown in FIG. 1.

The present embodiment differs from the first embodiment described above in that the opening region 26b in the metal film 26 which defines the opening near the peripheral portion of the semiconductor chip is wider than an opening region 26a of the metal film 26 which defines the opening near the center of the semiconductor chip.

The present embodiment is manufactured by a similar method to that of the first embodiment. However, in the mask used to pattern the metal film 26 for defining the opening, the width of the openings which define the openings in the photodiode 22 in the center portion of the semiconductor chip is wider than the width of the openings which define the openings in the photodiode 22 in the peripheral portion of the semiconductor chip. That is, the area of the openings which define the openings in the photodiode 22 inside the semiconductor chip is wider at the peripheral portion of the semiconductor chip than in the center of the semiconductor chip.

Thereafter, the solid-state image sensor device of the present embodiment can be completed using a conventional manufacturing method to provide a passivation film, a color filter, and a microlens, as in the first embodiment.

The structure of the present embodiment achieves the same effects as the first embodiment. In addition, by making the opening regions near the peripheral portion of the semiconductor chip wider than the opening regions near the center of the semiconductor chip, reduced sensitivity in the peripheral portion of the semiconductor chip can be avoided even more reliably.

Embodiment 3

Figure 5A:
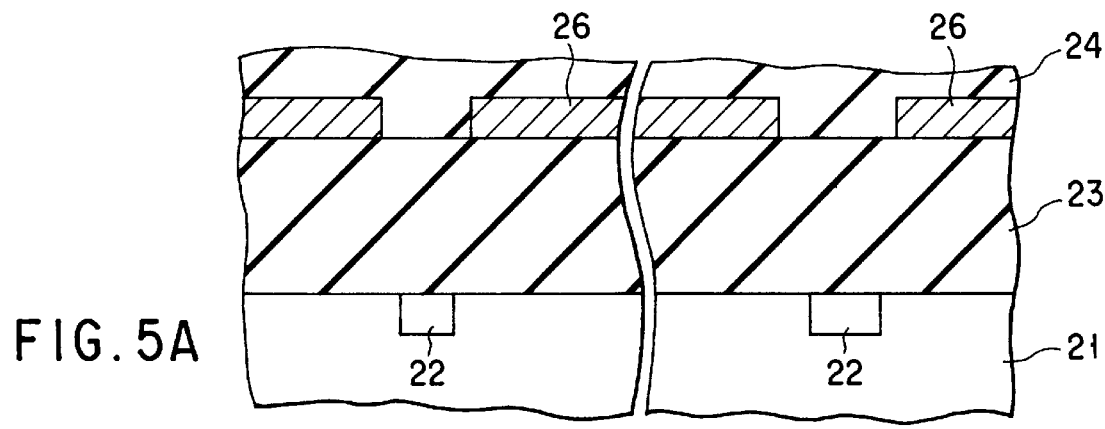
FIGS. 5A and 5B are diagrams to explain a sensor device of a third embodiment of the present invention, FIG. 5A showing a schematic cross-sectional view of the sensor device, in particular, the positional relationship of a photoconverter and a metal film which defines the area of an opening in a photodiode, FIG. 5B showing a plan pattern view thereof.
Figure 5B:
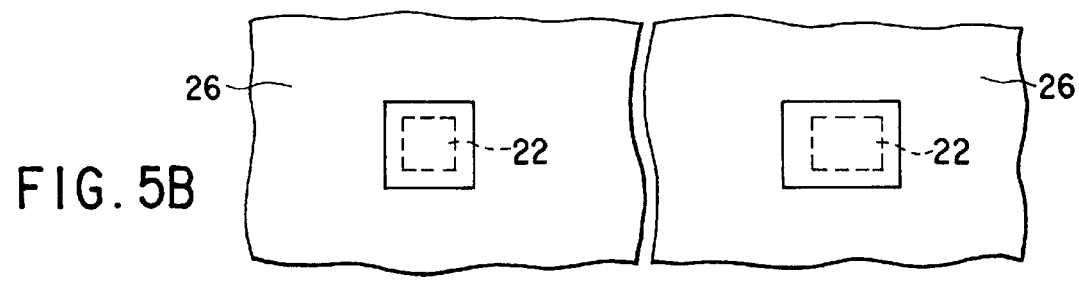
Figure 6:
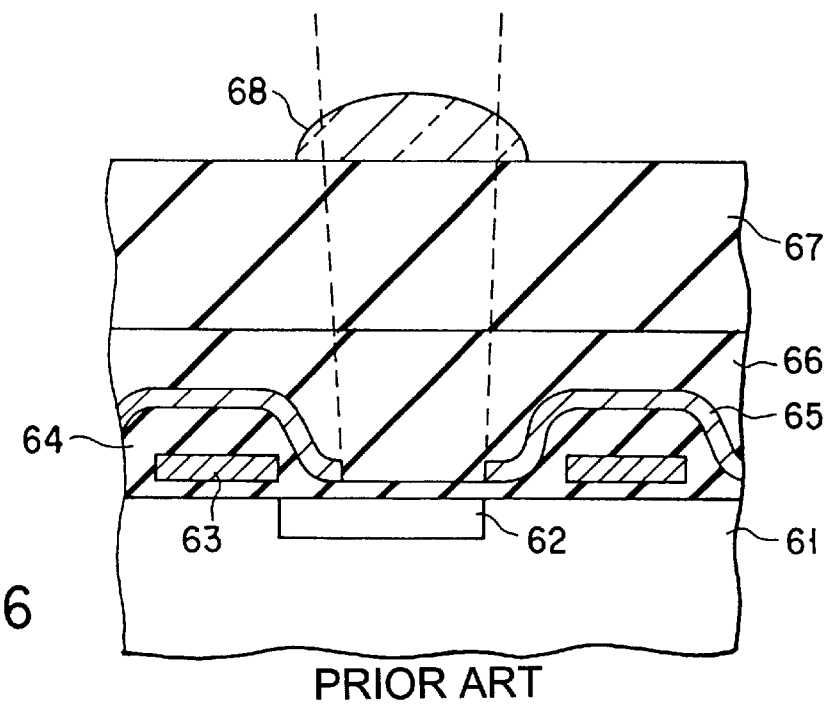
FIG. 6 is a cross-sectional view of a structure of an element showing a conventional CCD image sensor device.
Figure 7:
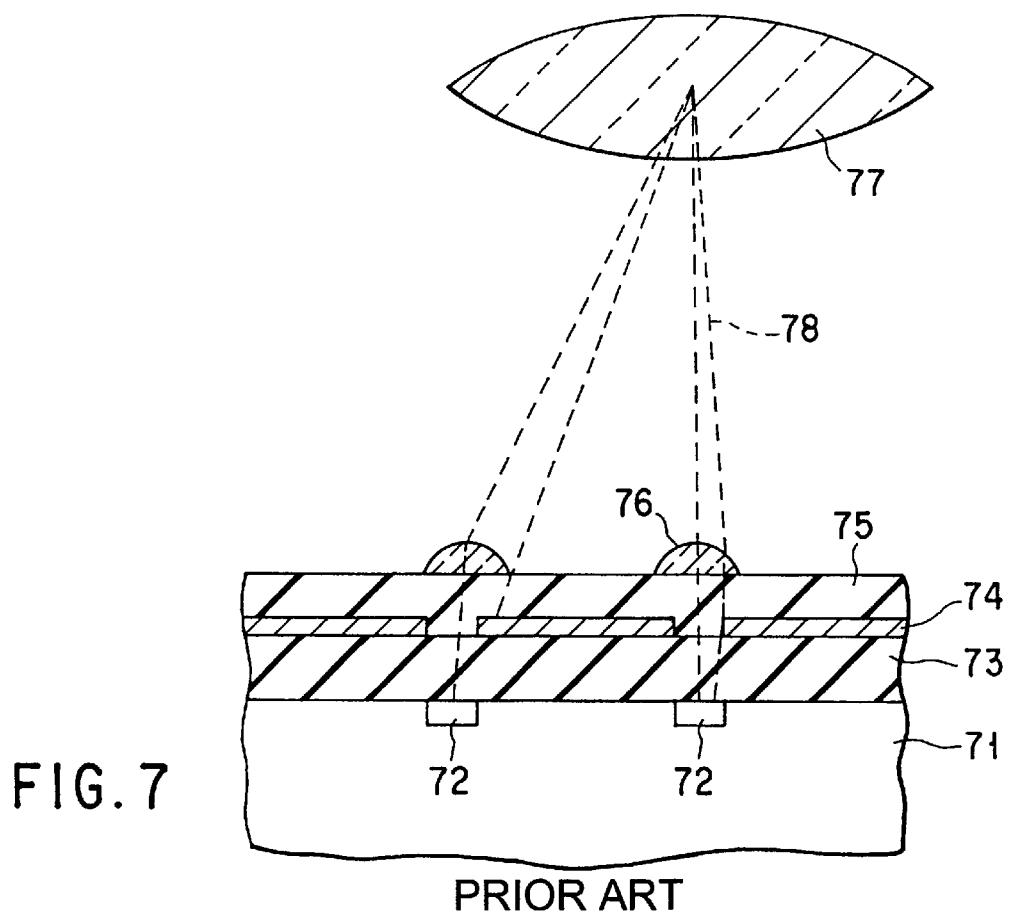
FIG. 7 is a diagram showing a light path when light enters a photoconverter in the center of a semiconductor chip and a photoconverter at the peripheral portion of the semiconductor chip.

FIGS. 5A and 5B schematically show element structures of a CMOS sensor according to a third embodiment of the present invention, FIG. 5A being a cross-sectional view, and FIG. 5B, a plan view. In particular, these diagrams show the positional relationship between a photodiode (photoconverter) and a metal film which defines the area of the opening in the photodiode. Parts identical to those in FIG. 2 are represented by the same reference numerals, and further detailed explanation thereof is omitted. The overall circuit is the same as that shown in FIG. 1.

The present embodiment differs from the second embodiment described above in that the area of the photodiodes 22 for photoconversion is different between in the center of the semiconductor chip and at the peripheral portions of the semiconductor chip. That is, the area of the photodiodes 22 in the peripheral portions of the semiconductor chip is greater than the area of the photodiodes 22 in the center of the semiconductor chip.

To manufacture the present embodiment, in the mask used to form the photodiode, the area of photodiodes which correspond to the peripheral portions of the semiconductor chip is wider than the area of photodiodes corresponding to the center of the semiconductor chip. The solid-state image sensor device of the present embodiment can be obtained by using a mask having such a characteristic.

Such a structure achieves the similar effects to those of the second embodiment.

The present invention is not limited to the embodiments described above. The circuit of a basic cell forming one pixel is not limited to that shown in FIG. 1, and any which enables a signal charge obtained at a photoconverter to be amplified and extracted is acceptable. Furthermore, conditions such as the amount of displacement of the center of the opening in the metal film in a pixel in the peripheral portion of the semiconductor chip, and the amount by which the area of the opening is increased, may be set as is deemed appropriate. Furthermore, an image input device (electronic camera system) capable of picking up images can be made using the amplifier-type solid-state image sensor device of the present invention. In addition, various modifications are possible which do not fall outside the scope of the present invention.

As explained in detail above, according to the present invention, in an amplifier-type solid-state image sensor device, the center of an opening region in a metal film which defines a region to which light is radiated in a photoconverter, is displaced to the sides of the center of an image sensing region with respect to the center of each corresponding photoconverter. Consequently, it is possible to limit the reduction in sensitivity at peripheral portions of the semiconductor chip, even when there is a considerable difference in level between the surface of the photodiode and the metal film which defines the opening, sensitivity can be made uniform at the center and peripheral portions of the image sensing region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier-type solid-state image sensor device comprising:
   a plurality of unit cells, each comprising a photoconverter and a signal scanning circuit, arranged two-dimensionally in an image sensing region on a semiconductor substrate;
   signal lines provided on the semiconductor substrate, for reading out signals from the unit cells in the image sensing region; and
   a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell.

2. An amplifier-type solid-state image sensor device according to claim 1, further comprising microlenses arranged for the unit cells, a center position of each of the microlenses being displaced to the side of the center of the image sensing region with respect to a center position of the photoconverter of a corresponding unit cell.

3. An amplifier-type solid-state image sensor device according to claim 1, wherein the metal film comprises an aluminum wire film.

4. An amplifier-type solid-state image sensor device according to claim 1, wherein the metal film comprises a film made of a refractory metal.

5. An amplifier-type solid-state image sensor device according to claim 4, wherein the refractory metal includes titanium, tungsten, and molybdenum.

6. An amplifier-type solid-state image sensor device according to claim 1, wherein the metal film comprises a film made of a metal compound.

7. An amplifier-type solid-state image sensor device according to claim 1, wherein the metal film comprises an aluminum lightproof film.

8. An amplifier-type solid-state image sensor device comprising:
   a plurality of unit cells, each comprising a photoconverter and a signal scanning circuit, arranged two-dimensionally in an image sensing region on a semiconductor substrate;
   signal lines provided on the semiconductor substrate, for reading out signals from the unit cells in the image sensing region; and
   a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell, the areas of those openings of the metal film, which are in a peripheral portion of the image sensing region, being larger than the areas of those of the openings of the metal film, which are in a center portion of the image sensing region.

9. An amplifier-type solid-state image sensor device according to claim 8, further comprising microlenses arranged for the unit cells, a center position of each of the microlenses being displaced to the side of the center of the image sensing region with respect to a center position of the photoconverter of a corresponding unit cell.

10. An amplifier-type solid-state image sensor device according to claim 8, wherein the metal film comprises an aluminum wire film.

11. An amplifier-type solid-state image sensor device according to claim 8, wherein the metal film comprises a film made of a refractory metal.

12. An amplifier-type solid-state image sensor device according to claim 11, wherein the refractory metal includes titanium, tungsten, and molybdenum.

13. An amplifier-type solid-state image sensor device according to claim 8, wherein the metal film comprises a film made of a metal compound.

14. An amplifier-type solid-state image sensor device according to claim 8, wherein the metal film comprises an aluminum lightproof film.

15. An amplifier-type solid-state image sensor device comprising:
   a plurality of unit cells, each comprising a photoconverter and a signal scanning circuit, arranged two-dimensionally in an image sensing region on a semiconductor substrate;
   signal lines provided on the semiconductor substrate, for reading out signals from the unit cells in the image sensing region; and
   a metal film having openings defining regions of the photoconverters of the unit cells, onto which regions light is radiated through the openings, a center position of each of the openings of the metal film being displaced to the side of the center of the image sensing region with respect to a center position of the photoconverter of a corresponding unit cell, the areas of those openings of the metal film, which are in a peripheral portion of the image sensing region, being larger than the areas of those of the openings of the metal film, which are in a center portion of the image sensing region, the areas of the photoconverters of those of the unit cells, which are in a peripheral portion of the image sensing region, being larger than the areas of the photoconverters of those of the unit cells, which are in a center portion of the image sensing region.

16. An amplifier-type solid-state image sensor device according to claim 15, further comprising microlenses arranged for the unit cells, a center position of each of the microlenses being displaced to the side of the center of the image sensing region with respect to a center position of the photoconverter of a corresponding unit cell.

17. An amplifier-type solid-state image sensor device according to claim 15, wherein the metal film comprises an aluminum wire film.

18. An amplifier-type solid-state image sensor device according to claim 15, wherein the metal film comprises a film made of a refractory metal.

19. An amplifier-type solid-state image sensor device according to claim 18, wherein the refractory metal includes titanium, tungsten, and molybdenum.

20. An amplifier-type solid-state image sensor device according to claim 15, wherein the metal film comprises a film made of a metal compound.

21. An amplifier-type solid-state image sensor device according to claim 15, wherein the metal film comprises an aluminum lightproof film.

* * * * *